(12) United States Patent
Heberlein (10) Patent No.: US 8,446,149 B2
(45) Date of Patent: May 21, 2013

(54) SYSTEM FOR IMPROVED MR IMAGE RECONSTRUCTION

(75) Inventor: Keith Aaron Heberlein, Charleston, WV (US)

(73) Assignee: Siemens Medical Solutions USA, Inc., Malvern, PA (US)

(*) Notice: Subject to any disclaimer, the term of this patent is extended or adjusted under 35 U.S.C. 154(b) by 515 days.

(21) Appl. No.: 12/758,831

(22) Filed: Apr. 13, 2010

(65) Prior Publication Data

US 2010/0264923 A1 Oct. 21, 2010

Related U.S. Application Data

(60) Provisional application No. 61/170,402, filed on Apr. 17, 2009.

(51) Int. Cl.
*G01V 3/00* (2006.01)
*G01R 33/48* (2006.01)

(52) U.S. Cl.
USPC ........... 324/309; 324/307; 324/318; 600/420; 382/131

(58) Field of Classification Search
USPC .................... 324/300–322; 600/407–464
See application file for complete search history.

(56) References Cited

U.S. PATENT DOCUMENTS

| 6,486,671 | B1* | 11/2002 | King | 324/307 |
|---|---|---|---|---|
| 6,724,923 | B2* | 4/2004 | Ma et al. | 382/131 |
| 6,980,001 | B2 | 12/2005 | Paley | |
| 7,279,893 | B1* | 10/2007 | Marinelli et al. | 324/307 |
| 7,336,145 | B1 | 2/2008 | Zelinski et al. | |
| 7,352,182 | B1* | 4/2008 | Steckner | 324/309 |
| 7,423,430 | B1 | 9/2008 | Sharif | |
| 7,768,264 | B1* | 8/2010 | Brau et al. | 324/309 |
| 7,960,972 | B2* | 6/2011 | Benschop | 324/309 |
| 2004/0044280 | A1 | 3/2004 | Paley | |
| 2006/0273792 | A1* | 12/2006 | Kholmovski et al. | 324/309 |

* cited by examiner

*Primary Examiner* — Jermele M Hollington
*Assistant Examiner* — Emily Chan
(74) *Attorney, Agent, or Firm* — Alexander J Burke (57) ABSTRACT

A system for parallel image processing in MR imaging uses multiple MR imaging RF coils to individually receive MR imaging data representing a slice of patient anatomy. An MR imaging system uses the multiple RF coils to acquire corresponding multiple image data sets of the slice. A coil selection processor determines a prioritized ranking of the multiple RF coils by ranking individual coils of the multiple RF coils based on correlation with remaining coils of the multiple RF coils. The correlation being determined by determining degree of correlation of image data sets acquired by respective coils of the multiple RF coils. The coil selection processor selects a subset of the multiple RF coils using the ranking. An image generator generates a composite MR image using image data sets provided by the selected subset of the multiple RF coils excluding image data sets provide by remaining coils of the multiple RF coils.

21 Claims, 11 Drawing Sheets

SYSTEM FOR IMPROVED MR IMAGE RECONSTRUCTION

This is a non-provisional application of provisional application Ser. No. 61/170,402 filed 17 Apr., 2009, by K. A. Heberlein.

FIELD OF THE INVENTION

This invention concerns a system for parallel image processing in MR imaging by generating a composite MR image using image data sets provided by a selected prioritized subset of RF coils of multiple RF coils of an MR imaging system.

BACKGROUND OF THE INVENTION

Parallel imaging with multiple receivers is employed in known Magnetic Resonance Imaging (MRI) systems that are used both clinically and in basic science research. GRAPPA (generalized auto-calibrating partially parallel acquisitions) based reconstructions fill in missing k-space data using a local weighted average of neighboring k-space signals acquired by multiple receiver elements. K-space is the temporary image space in which data from digitized MR signals is stored during data acquisition and comprises raw data in a spatial frequency domain before reconstruction. When k-space is full (at the end of an MR scan), the data is mathematically processed to produce a final image. Given a limited set of auto-calibration data, the number of parameters to fit can rapidly approach the same order as the number of equations determined by the number of calibration data points. Over-fitting the calibration data makes the result sensitive to noise and unstable. At the opposite extreme under-fitting the data also results in poor image reconstruction and residual aliasing artifacts. Both issues become more sensitive with high reduction factors, limited calibration data or high-channel coil arrays. A parsimonious choice of reconstruction kernel minimizes residual fitting error of the model while simultaneously penalizing over-complex models. Known systems fail to comprehensively extend the kernel resulting in less than optimal MR image reconstruction. A system according to invention principles addresses these deficiencies and related problems.

SUMMARY OF THE INVENTION

A system ranks RF coils based on the proximity of the coils in a coil array using a cross-covariance measure and giving higher ranking to coil elements that overlap similar regions of an object being imaged. A system for parallel image processing in MR imaging uses multiple MR imaging RF coils to individually receive MR imaging data representing a slice of patient anatomy. An MR imaging system uses the multiple RF coils to acquire corresponding multiple image data sets of the slice. A coil selection processor determines a prioritized ranking of the multiple RF coils by ranking individual coils of the multiple RF coils based on correlation with remaining coils of the multiple RF coils. The correlation being determined by determining degree of correlation of image data sets acquired by respective coils of the multiple RF coils. The coil selection processor selects a subset of the multiple RF coils using the ranking. An image generator generates a composite MR image using image data sets provided by the selected subset of the multiple RF coils excluding image data sets provide by remaining coils of the multiple RF coils.

DETAILED DESCRIPTION OF THE INVENTION

It is typically assumed that parallel MR image data processing and reconstruction is improved by increasing the number of RF coil elements employed in the reconstruction. In contrast, a system according to invention principles, improves GRAPPA (generalized auto-calibrating partially parallel acquisitions) based image reconstruction by optimizing reconstruction parameters on a coil by coil basis. The system is counter-intuitive and belies the assumption that the use of more RF coil channels inevitably results in improved image quality. The inventor has advantageously recognized that for a given single-coil image reconstruction there exists a subset of coil elements which contribute more to reconstruction and another subset that overcomplicates the estimation model resulting in noise enhancement. As used herein RF coils 4 comprises multiple RF coils individually comprising a coil providing RF image data that is used in parallel to generate a single MR image. In "synthetic" coil direction of k-space kernel processing there is a lack of a metric to determine what coil elements (coil neighborhood) should be used. Given a large array, an exhaustive search of coil combinations is impractical. The system further advantageously provides a coil ranking method and metric based on the proximity of the coils in the array. Furthermore the metric is data driven and does not rely on prior knowledge of coil geometry. Instead the coils are ranked by their cross-covariance with the assumption that coil elements that overlap similar regions of the object are more important.

Figure 1:
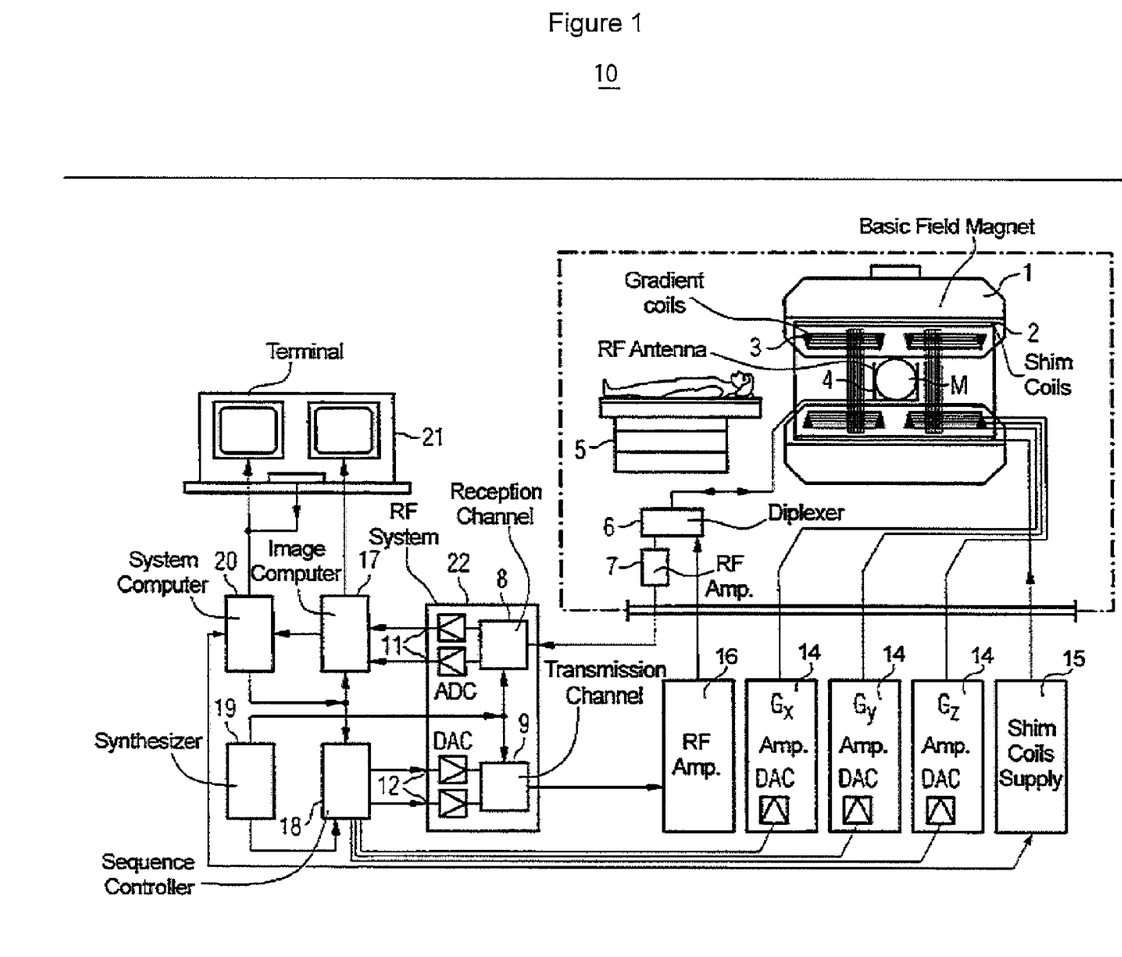
FIG. 1 shows a system for parallel image processing in MR imaging, according to invention principles.

FIG. 1 is a schematic block diagram of a system 10 including a magnetic resonance tomography device with which MR weighted images can be acquired according to principles of the present invention. A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M.

The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data, Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

System computer 20 automatically (or in response to user command entered via terminal 21) employs and directs the MR imaging device of system 10 for MR imaging using parallel image processing. Multiple MR imaging RF coils 4 individually receive MR imaging data representing a slice of patient anatomy. MR imaging system 10 uses multiple RF coils 4 to acquire corresponding multiple image data sets of the slice. A coil selection processor in system computer 20 determines a prioritized ranking of the coils of RF coils 4 by ranking individual coils of RF coils 4 based on correlation with remaining coils of RF coils 4. The correlation is determined by determining degree of correlation of image data sets acquired by respective coils of RF coils 4. The coil selection processor selects a subset of RF coils 4 using the ranking. An image generator of imaging computer 17 generates a composite MR image using image data sets provided by the selected subset of RF coils 4 excluding image data sets provide by remaining coils of RF coils 4. The image generator provides the composite MR image for display on a reproduction device (e.g., terminal 21).

Figure 2:
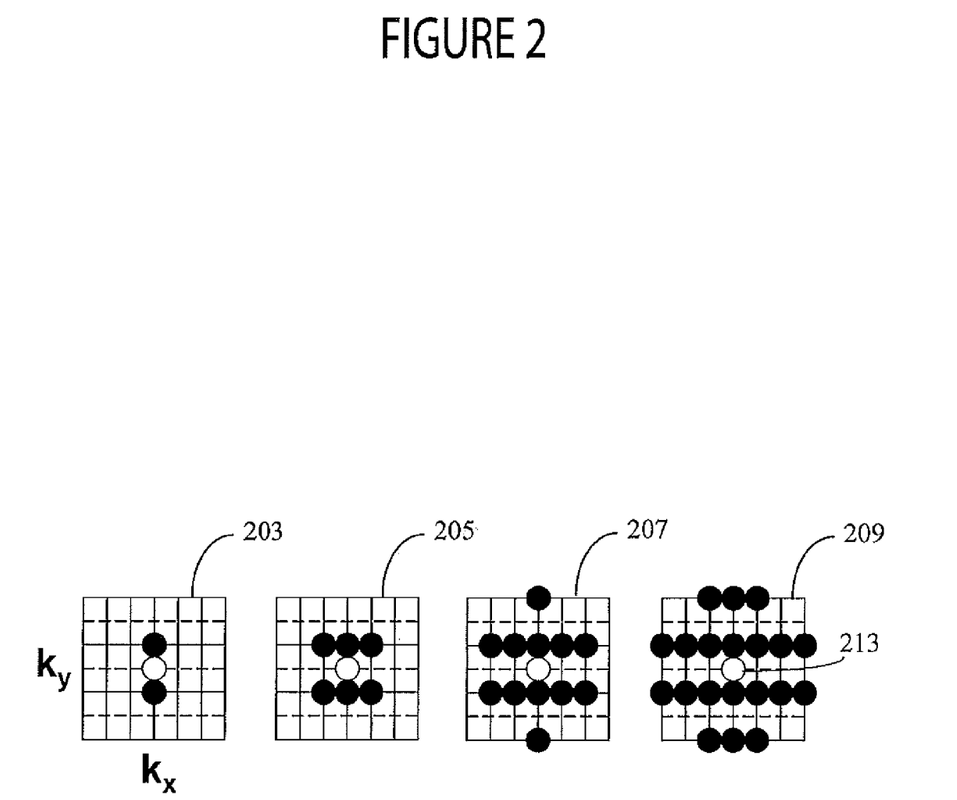
FIG. 2 illustrates k-space points closest to a target point representing a region of interest in k-space that are deemed more significant in RF coil subset selection, according to invention principles.

FIG. 2 shows k-space plots 203, 205, 207 and 209 indicating k-space points (in black) closest to a target point (in white) at the centre of the k-space (e.g., point 213). The k-space points in black of plots 203, 205, 207 and 209 represent a region of interest in k-space deemed more significant in RF coil subset selection. Specifically, the coil selection processor of computer 20 deems points closest to the target point in k-space to be more significant. Imaging computer 17 optimizes the set of k-space points (kernel) used in image construction in response to RF coil geometry, number of RF coils, number of auto-calibrating signal reference lines used in image reconstruction, and reduction factor (such as R=4 i.e. one quarter of the data is acquired and processed or R=3 or R=2 for example) indicating degree of sub-sampling reduction of k-space points used in accelerated image reconstruction.

Figure 3:
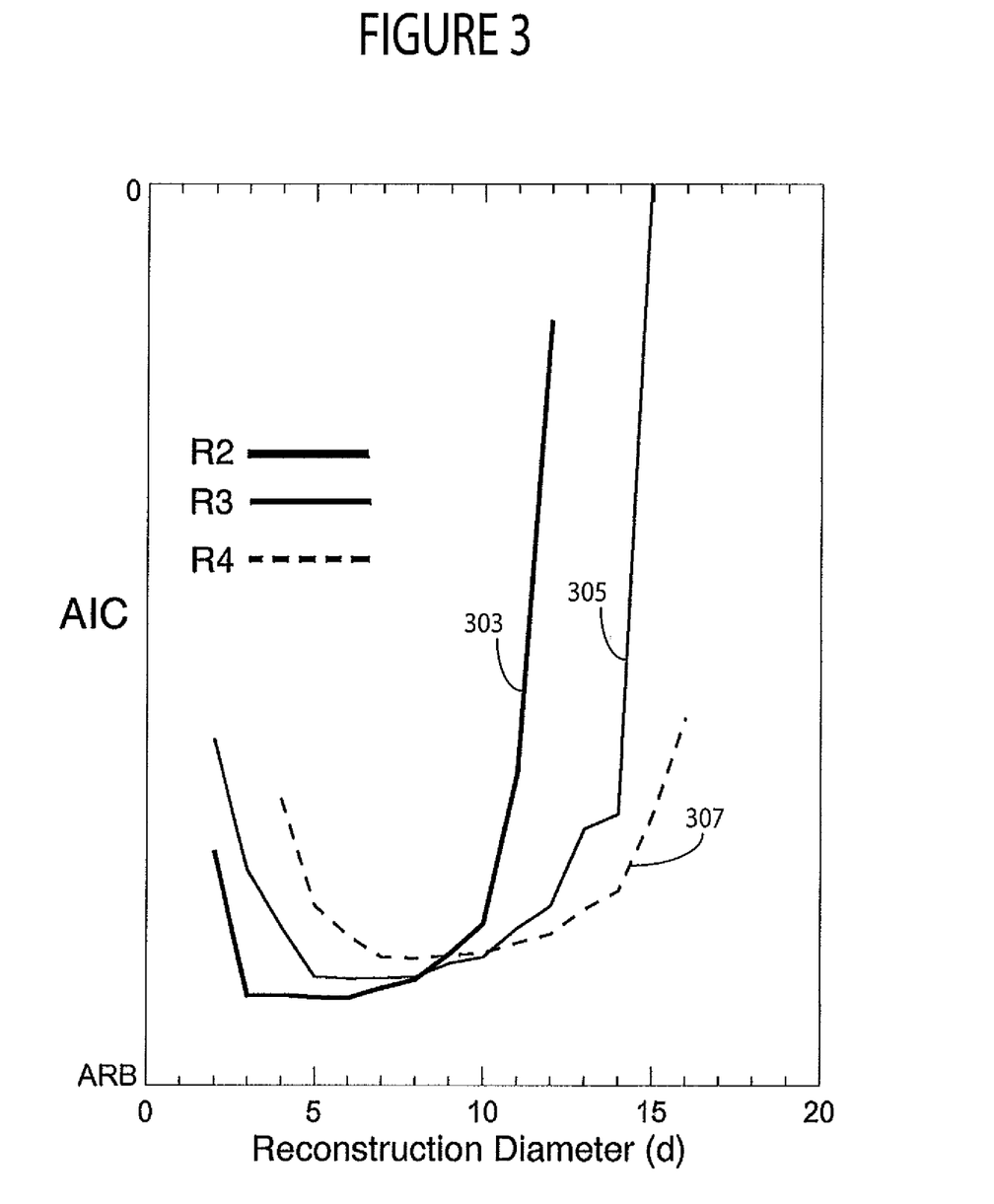
FIG. 3 shows a plot of an information criterion representing information lost against diameter of an image area reconstructed for three different selected RF coil subsets, according to invention principles.

FIG. 3 shows three graphs of an information criterion representing information lost against diameter of an image area reconstructed for reconstruction performed using three different reduction factors. Specifically, graph 303 is a plot of an Akaike information criterion (AIC) against diameter of an image area reconstructed using a reduction factor of R=2.

AIC was derived by Hirotsugu Akaike in 1971 and is a measure of the goodness of fit of an estimated statistical model and offers a relative measure of the information lost when a given model is used to describe reality. Given a data set, several competing models may be ranked according to their AIC, with the one having the lowest AIC being the best. Graph 305 is a plot of an Akaike information criterion (AIC) against diameter of an image area reconstructed using a reduction factor of R=3. Graph 307 is a plot of an Akaike information criterion (AIC) against diameter of an image area reconstructed using a reduction factor of R=4.

Figure 4:
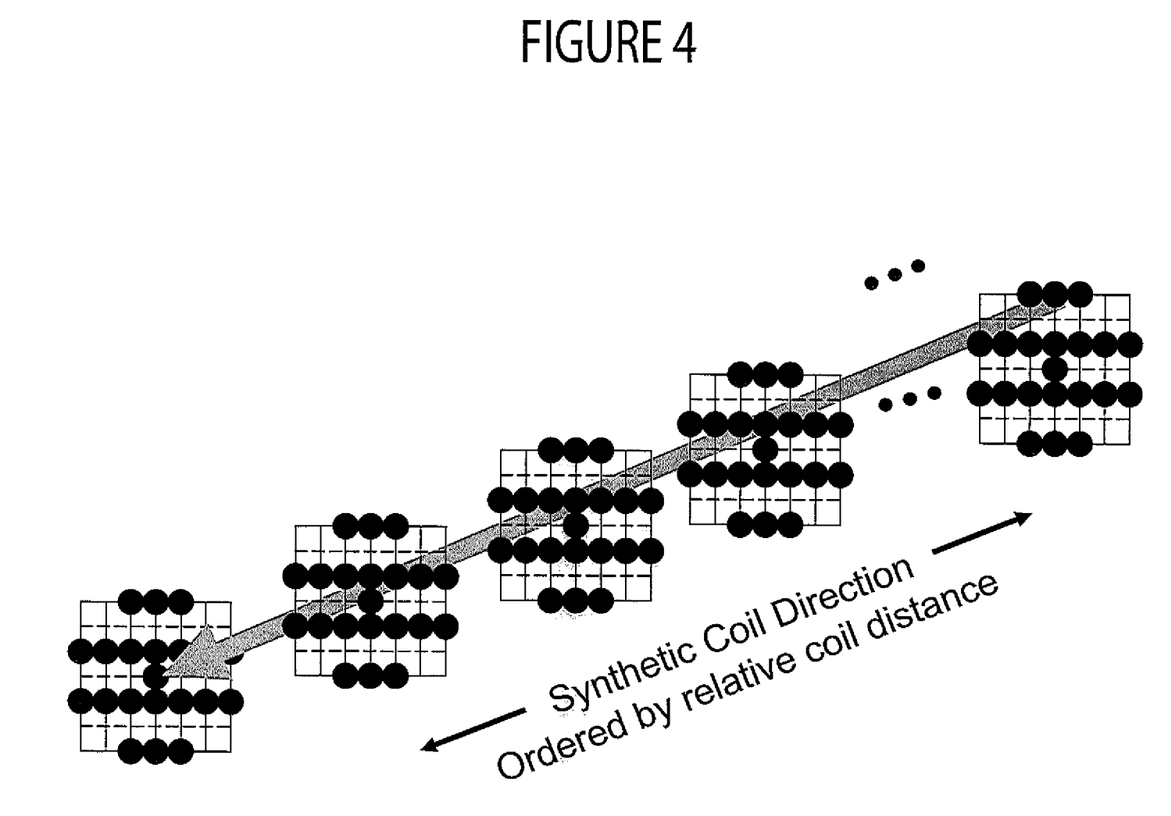
FIG. 4 illustrates RF coil selection for image reconstruction with GRAPPA, according to invention principles.

FIG. 4 illustrates RF coil selection for image reconstruction with GRAPPA. K-space kernel datasets 1 to N are provided by corresponding RF coils 1 to N and k-space dataset 1 is provided by RF coil 1 that is closest to an anatomical region of interest (ROI). The coil selection processor in system computer 20 in one embodiment, employs k-space data derived using RF coils closer together in coil-space and closest to the ROI. The system advantageously uses a synthetic coil direction as illustrated in FIG. 4. Data derived using RF coils that are closer together in coil-space (i.e. in the same neighborhood) and closest to a ROI, is deemed more significant by the coil selection processor. The coil selection processor, in one embodiment, uses a subset of coils that contribute to coil-location based image reconstruction. The coil selection processor data selection method recognizes that data provided by some RF coils overcomplicate image reconstruction and enhance noise.

Figure 5:
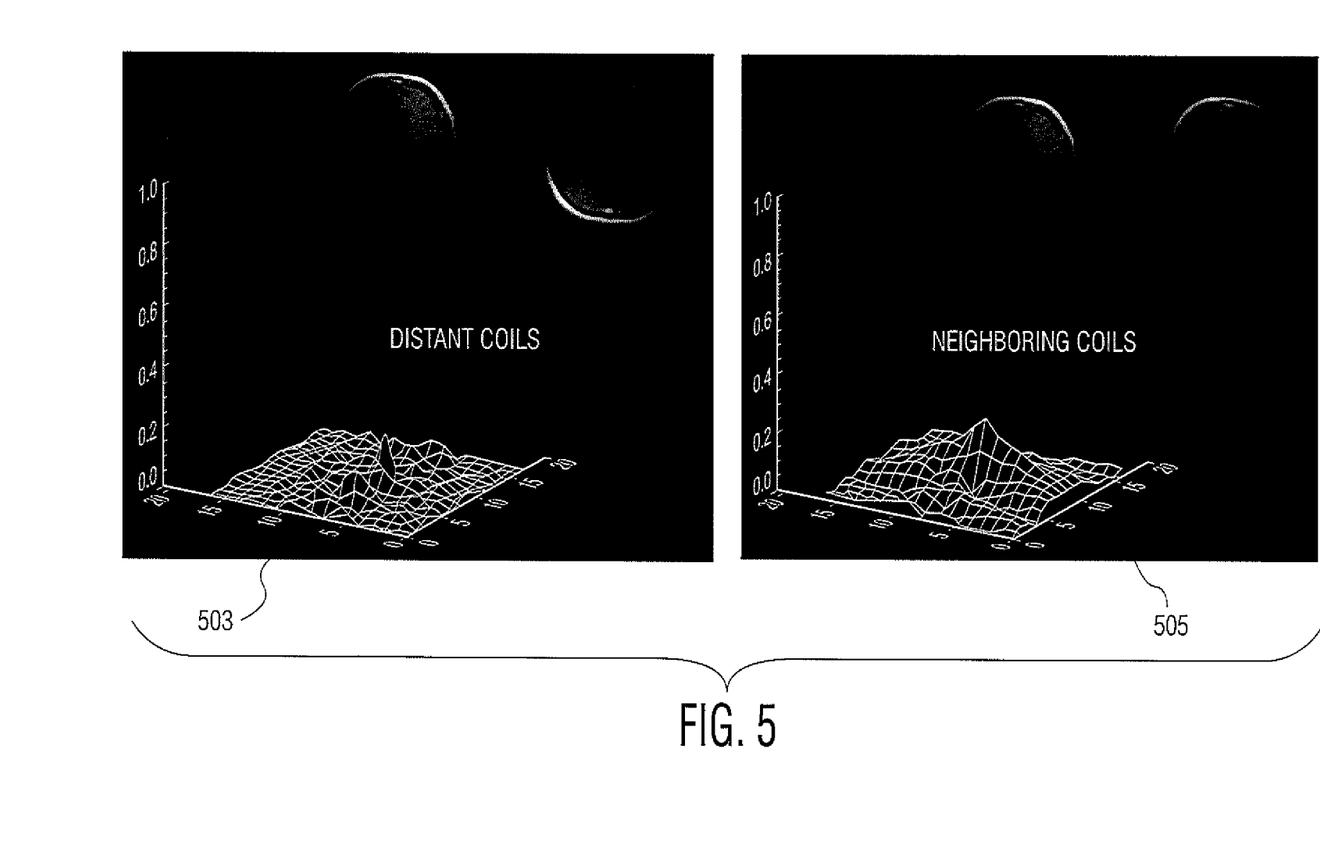
FIG. 5 illustrates use of cross-covariance for determining selection of RF coils and coil space, according to invention principles.

FIG. 5 illustrates use of cross-covariance for determining selection of RF coils and coil space rather than physical measurements of the coil geometry. Specifically, 3D graph plot 505 qualitatively illustrates improvement (over corresponding plot 503) in image reconstruction using a subset of coils selected using a cross-covariance measure derived using image representative data provided by selected RF coils (excluding use of data from non-selected coils). In contrast, graph plot 503 illustrates a lower image reconstruction accuracy achieved using data from a full set of RF coils including the coils most distant from a ROI.

Figure 6:
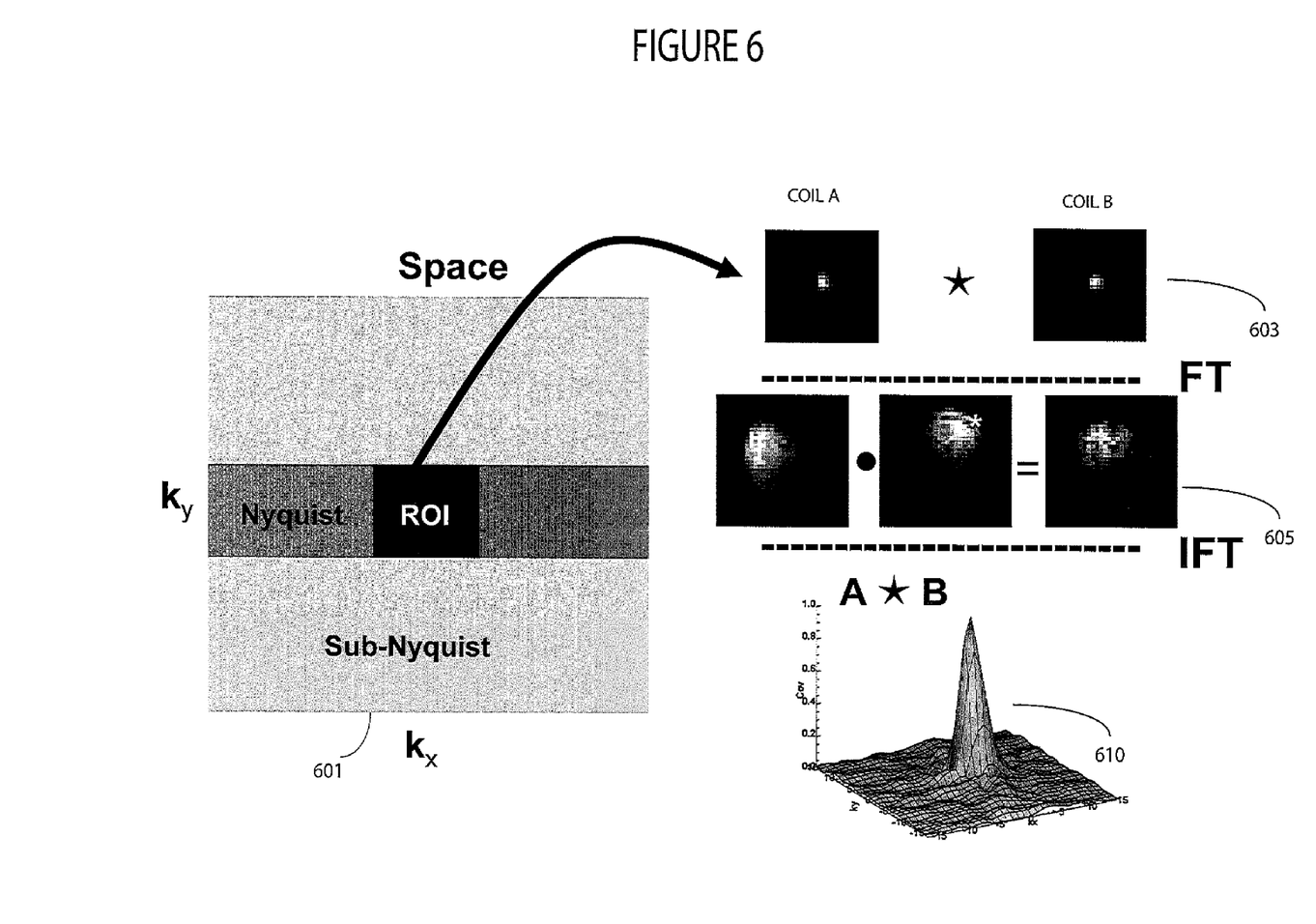
FIG. 6 illustrates computing coil cross covariance using a Fast Fourier Transform (FFT), according to invention principles.
Figure 7:
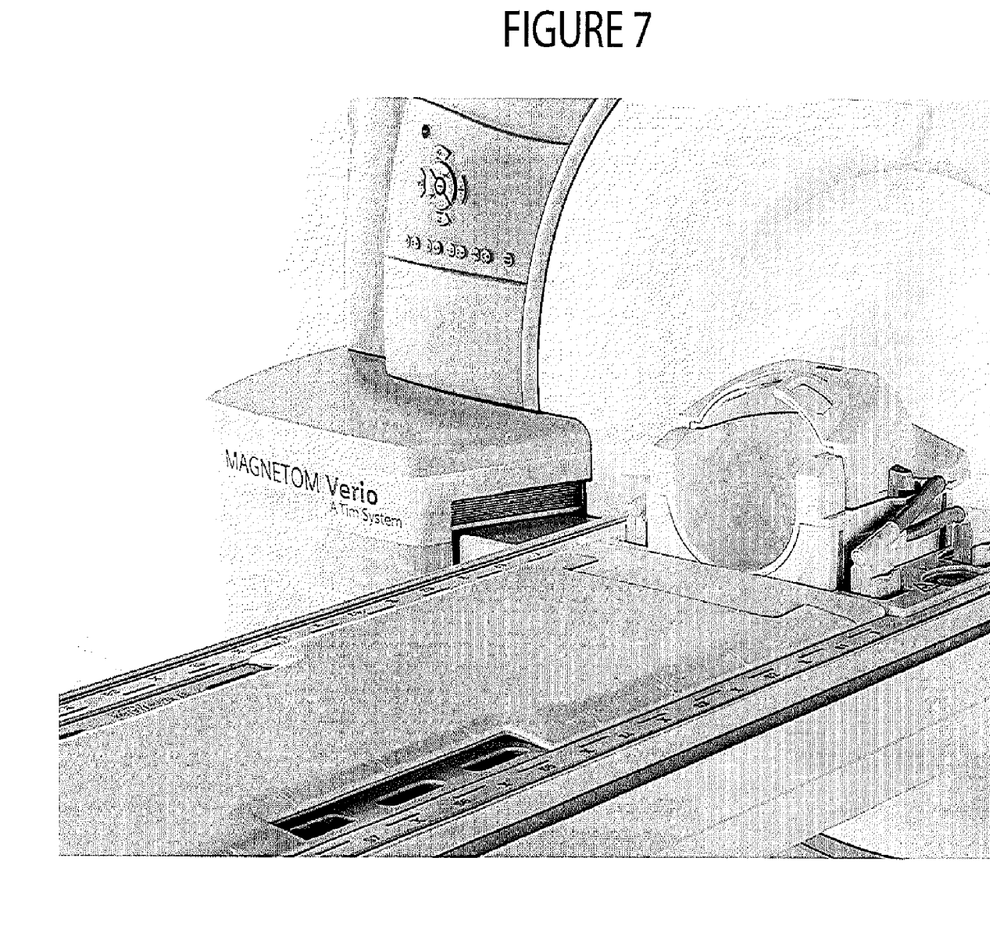
FIG. 7 shows an MR imaging device used for acquiring imaging data used in reconstruction simulation performed offline, according to invention principles.

FIG. 6 illustrates computing coil element cross covariance using a Fast Fourier Transform (FFT) employed by the MR imaging device of FIG. 7 that acquires imaging data used in reconstruction simulation performed offline. System 10 (FIG. 1) employs the imaging device of FIG. 7 comprising a 3 Tesla MR imaging device using a 32 channel head coil and assumes a calibration pre-scan of 24 auto-calibration (reference) lines. System 10 generates GRAPPA data with R4 reduction factor acceleration by sub-sampling acquired high-resolution 0.5× 0.5 in-plane, T1-weighted spin echo k-space data (4 mm slice, Field of View (FOV) 256 mm, matrix 512, number of averages=1).

The coil selection processor in system computer 20 (FIG. 1) computes cross covariance for individual pairs of RF coils of RF coils 4 of system 10 and ranks the individual coils according to their maximum cross-covariance value with the remaining coils of coils 4. The coil selection processor computes cross-covariance between a pair of coils such as coils A and B indicated in FIG. 6 by image domain multiplication by determining complex conjugates (using k-space data 601) comprising a Fourier transform 603 and performing an inverse Fourier transform 605. The cross-covariance between coils A and B is depicted in a 3D representation 610 and is derived using a known Fourier transform for fast computation of convolutions and covariance and deriving correlation (scaled or normalized from 0 to 1) for relative comparison.

Figure 8:
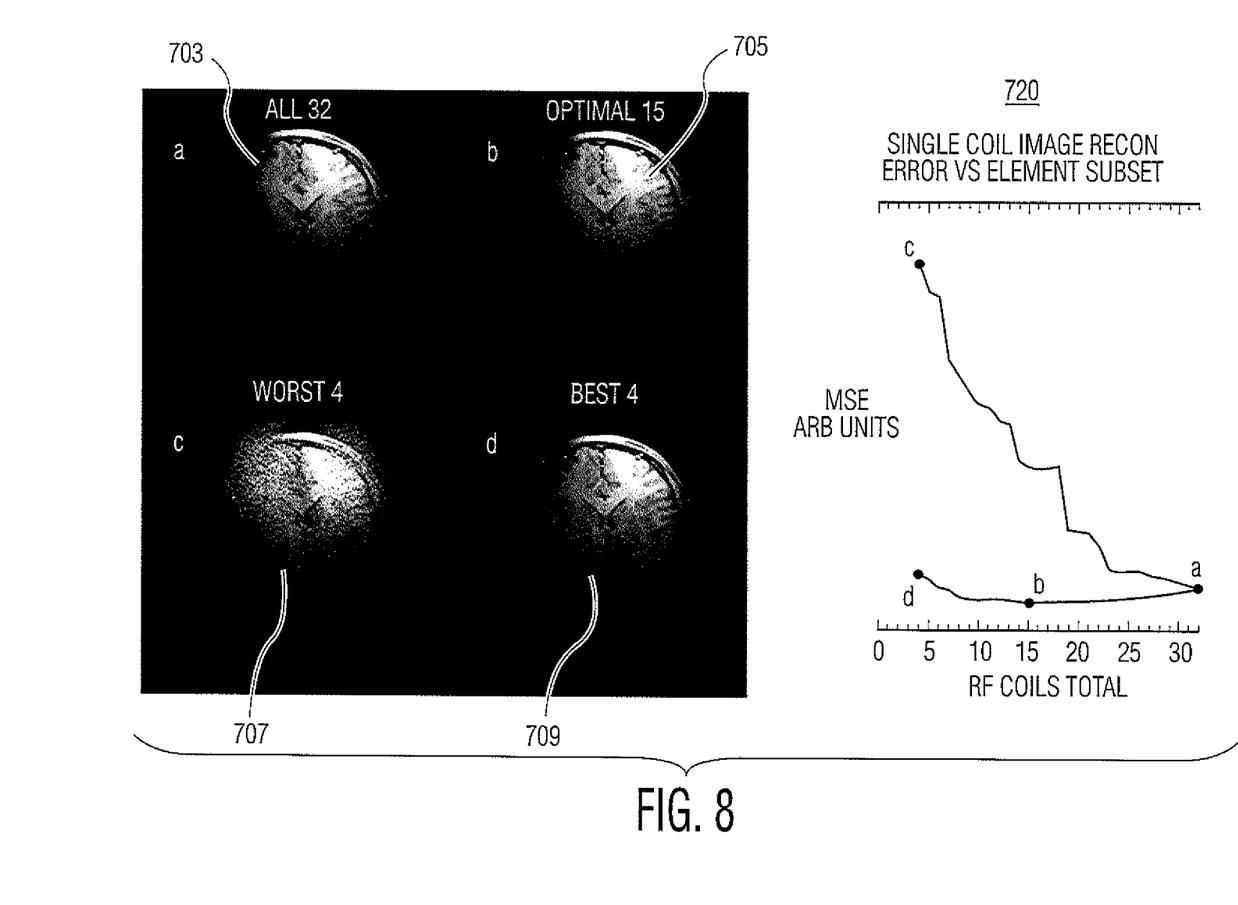
FIG. 8 illustrates image reconstruction and associated error for different RF coil subsets, according to invention principles.

FIG. 8 illustrates image reconstruction and associated error for different RF coil subsets selected according to cross-covariance ranking determined by the coil selection processor. Image a 703 is reconstructed using MR signal data from all 32 RF coils of the FIG. 7 imaging device and image b 705 is reconstructed using MR signal data from the optimum15 RF coils of the FIG. 7 imaging device. Similarly, image c 707 is reconstructed using MR signal data from the worst 4 RF coils of the FIG. 7 imaging device and image d 709 is reconstructed using MR signal data from the best 4 RF coils of the FIG. 7 imaging device. Graph 720 shows plots of mean squared image reconstruction error (MSE) against number of RF coils used for the different RF coil data of images a 703, b 705, c 707 and d 709. MSE is shown with arbitrary units and comprises a square of a difference between fully sampled image data derived using a full (32 coil) set and reconstructed image data derived using a selected RF coil set (a, b, c or d) with accelerated reconstruction using R=4 reduction factor. Graph 720 indicates RF coil set c comprising the worst four coils produces far larger errors than coils sets a, b or d indicating that data from the worst RF coils is advantageously excluded by the coil selection processor.

Figure 9:
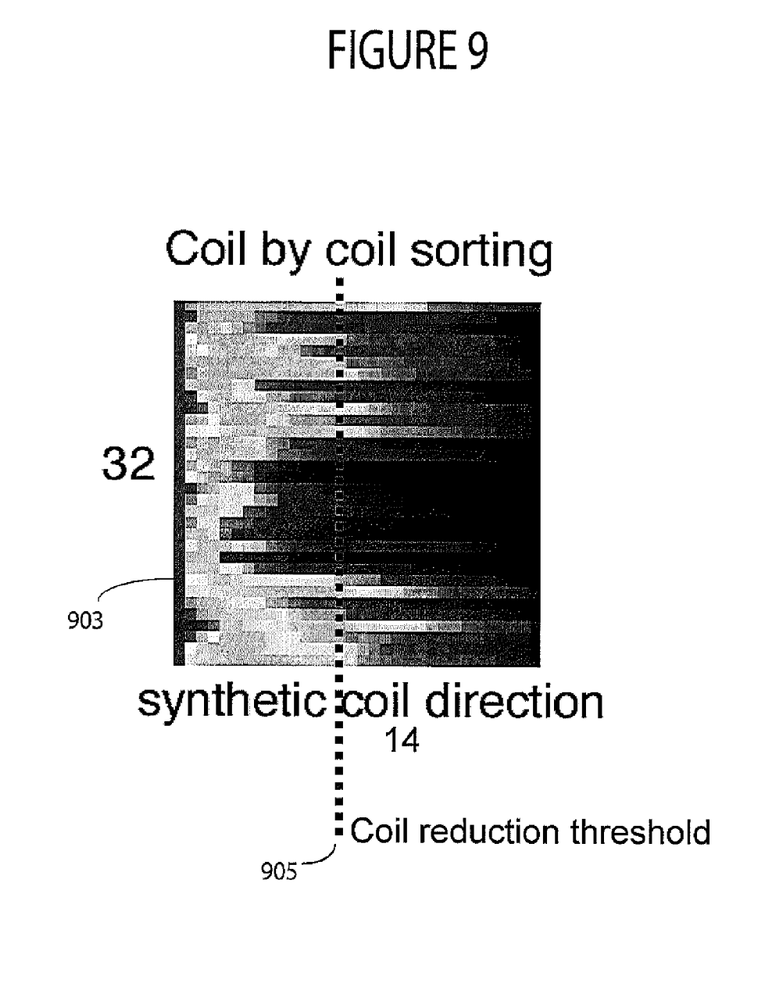
FIG. 9 illustrates an RF coil cross-covariance matrix representation and adjustable threshold for selecting an RF coil subset for image reconstruction, according to invention principles.

FIG. 9 illustrates an RF coil cross-covariance matrix representation and adjustable threshold for selecting an RF coil element subset for image reconstruction. The coil selection processor generates cross-covariance matrix 903 showing coil by coil rankings derived by computing coil cross-covariances that indicates strength of mutual received signal overlap and degree of match of coil sensitivity between pairs of RF coils. The coil selection processor determines the peak cross-covariance for the individual coil combinations to build covariance matrix 903. Specifically, the matrix in 32 by 32 elements pictorially represents in gray scale (or color) strength of mutual received signal overlap and degree of match of coil sensitivity between pairs of RF coils between each of 32 RF coils of an MR imaging device with the remaining coils of the 32 RF coils. The lighter the shade of the element in matrix 903, the greater is the mutual received signal overlap between a coil pair. The non-diagonal elements of matrix 903 represent strengths of mutual received signal overlap and degree of match of coil sensitivity between pairs of RF coils whereas diagonal elements represent auto-covariance of a single coil. The coil selection processor in system computer 20 sorts the rows of the covariance matrix to rank coils in response to strength of mutual received signal overlap for coil-wise reconstruction and adaptively adjusts threshold 905 left or right to correspondingly reduce or expand the subset of RF coils used in GRAPPA image reconstruction. For example, the position of threshold 905 in matrix 903 indicates that 14 RF coils to the left on the x-axis having the largest cross-covariance are selected for image reconstruction.

Figure 10:
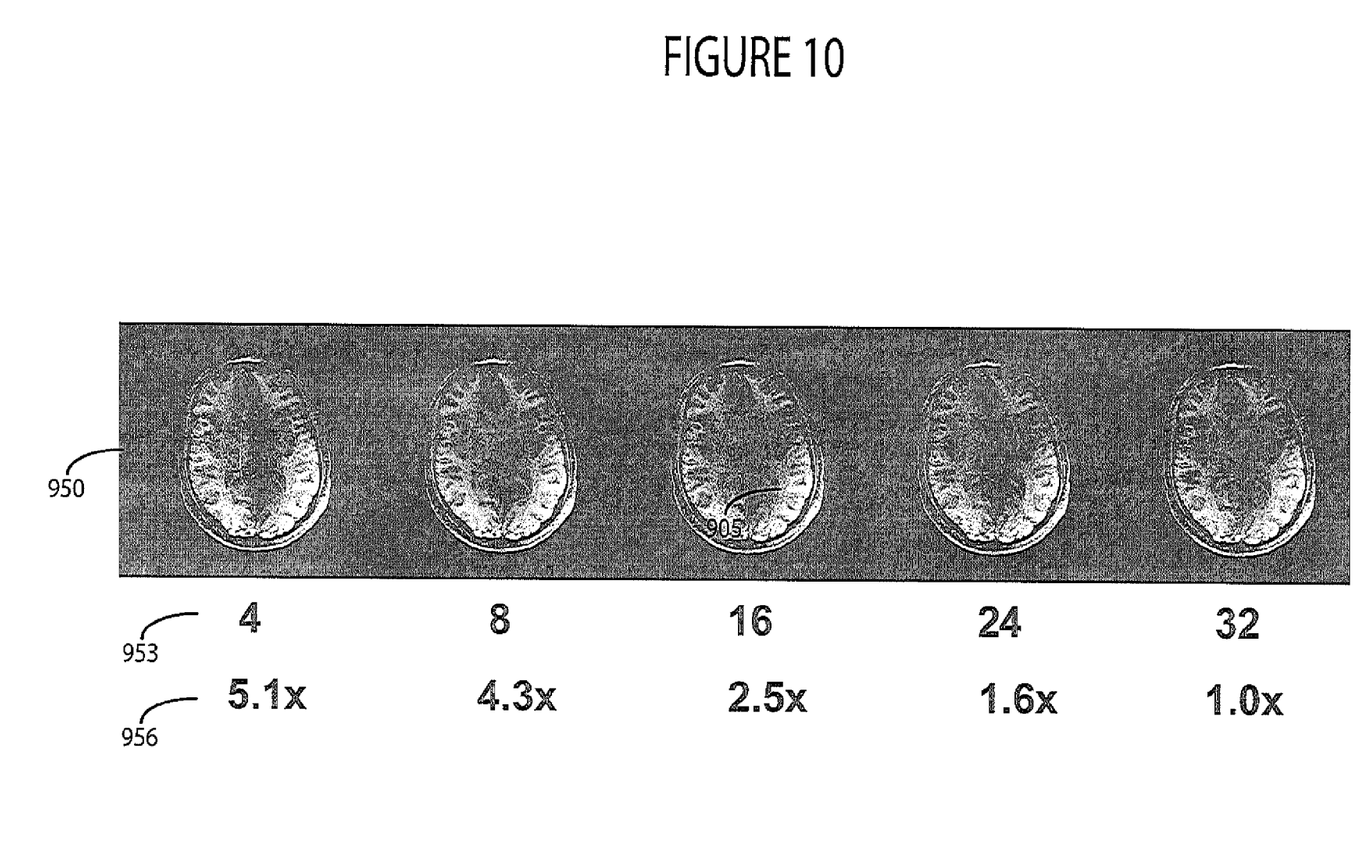
FIG. 10 illustrates imaging results with varying RF coil subset selection for image reconstruction, according to invention principles.

FIG. 10 illustrates imaging results with varying RF coil subset selection for image reconstruction. The coil selection processor uses the coil ranking provided by the covariances and adaptively adjusts the coil selection threshold (905 FIG. 9) to use the number of RF coils shown in row 953 in producing the corresponding reconstructed image in row 950. Specifically, kernel support in a particular coil direction is varied from 4 to 32 coils with corresponding sub-sampling data reduction factor shown in row 956. The covariance ranking system advantageously enables selection of an optimal subset of coils that may comprise half that of the total number of available coils, for example, thus concurrently reducing reconstruction times and improving image quality. In addition, in one embodiment the coil selection processor determines a reversed coil ranking to test the validity of a coil ranking.

Figure 11:
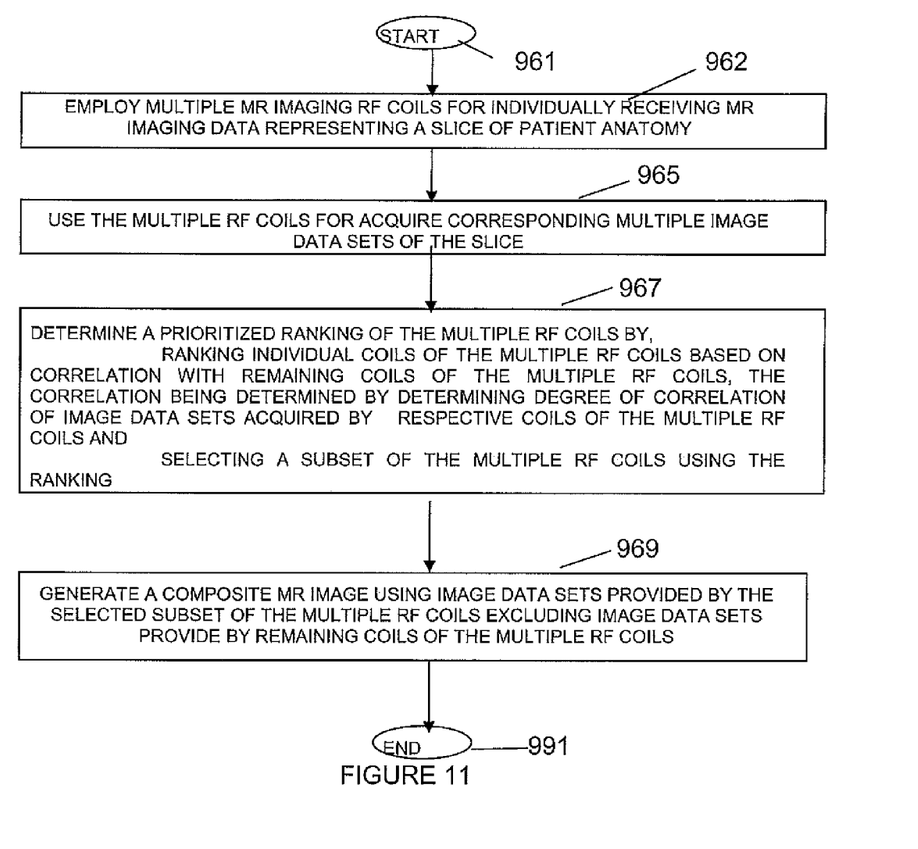
FIG. 11 shows a flowchart of a process performed by a system for parallel image processing in MR imaging, according to invention principles.

FIG. 11 shows a flowchart of a process performed by system 10 (FIG. 1) for parallel image processing in MR imaging. In step 962 following the start at step 961, system 10 employs multiple MR imaging RF coils 4 for individually receiving MR imaging data representing a slice of patient anatomy. In step 965 system 10 uses multiple RF coils 4 for acquiring corresponding multiple image data sets of the slice. In step 967 the coil selection processor in system computer 20 identifies coils comprising a prioritized ranking of the multiple RF coils by, ranking individual coils of the multiple RF coils based on correlation with remaining coils of the multiple RF coils and selecting a subset of the multiple RF coils in response to a ranking determined based on correlation factor exceeding a predetermined threshold and selecting a predetermined number of the multiple RF coils having the highest degree of correlation as the subset.

The coil selection processor determines the correlation by determining degree of correlation of image data sets acquired by respective coils of the multiple RF coils. Specifically, the coil selection processor uses a first coil of the multiple RF coils to acquire a first image data set representing the slice and uses a second coil of the multiple RF coils to acquire a second image data set representing the slice. Thereby, the coil selection processor determines individual correlation factors (cross-covariance) between individual pairs of coils of the multiple RF coils by multiplying data in the frequency domain comprising two Fourier Transformed representative image data sets of the slice acquired using an individual pair of coils. The coil selection processor ranks individual coils of the multiple RF coils based on a correlation factor determined between the first and second image data sets. Specifically, the coil selection processor ranks individual coils of the multiple RF coils based on a correlation factor (a peak value of the correlation factor in one embodiment) determined between pairs of coils of the multiple RF coils and sorts the multiple RF coils based on correlation factor. In step 969 an image generator in imaging computer 17 generates (or re-generates) a composite MR image using image data sets provided by the selected subset of the multiple RF coils excluding image data sets provide by remaining coils of the multiple RF coils by employing k-space domain parallel reconstruction. The process of FIG. 11 terminates at step 991.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-11 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system improves GRAPPA (generalized auto-calibrating partially parallel acquisitions) based image reconstruction by ranking RF coils and selecting a subset of RF coils based on cross-covariance with the assumption that coil elements that overlap similar regions of the object are more important. The system considers the spatial arrangement of coils around an object to improve coil reduction acceleration for coil-wise parallel MR reconstruction and reduces the number of channels per single coil reconstruction to improves reconstruction times and improve image quality. The system employs a coil cross-covariance metric to accelerate provision of a summary of the coil geometry specific to an MR excited volume, without array compression. The system is of particularly advantageous use in GRAPPA reconstruction with massively parallel systems, e.g., 128 RF channels. The system performs coil-wise image reconstruction with optimized kernels in both k-space and coil-space. Further, the processes and applications may, in alternative embodiments, be located on one or more (e.g., distributed) processing devices on a network linking the units of FIG. 1. Any of the functions and steps provided in FIGS. 1-11 may be implemented in hardware, software or a combination of both.

What is claimed is:
1. A system for parallel image processing in MR imaging, comprising:

a plurality of MR imaging RF coils for individually receiving MR imaging data representing a slice of patient anatomy;

an MR imaging system for using the plurality of RF coils for acquiring a corresponding plurality of image data sets of said slice;

a coil selection processor for determining a prioritized ranking of said plurality of RF coils by, ranking individual coils of said plurality of RF coils based on correlation with remaining coils of said plurality of RF coils, said correlation being determined by determining degree of correlation of image data sets acquired by RF coil pairs comprising individual coils of said plurality of RF coils paired with individual remaining coils of said plurality of RF coils and selecting a subset of said plurality of RF coils using the ranking; and an image generator for generating a composite MR image using image data sets provided by the selected subset of said plurality of RF coils excluding image data sets provide by remaining coils of said plurality of RF coils.

2. A system according to claim 1, wherein a first coil of said plurality of RF coils acquires a first image data set representing said slice, a second coil of said plurality of RF coils acquires a second image data set representing said slice and said coil selection processor ranks individual coils of said plurality of RF coils based on a correlation factor determined between the first and second image data sets.

3. A system according to claim 2, wherein said coil selection processor ranks said correlation factor between said first and second image data sets by multiplying data comprising Fourier Transformed representations of said first and second image data sets in the frequency domain.

4. A system according to claim 1, wherein said coil selection processor ranks individual coils of said plurality of RF coils based on a correlation factor determined between pairs of coils of said plurality of RF coils, individual correlation factors being determined between individual pairs of coils of said plurality of RF coils by multiplying data comprising two Fourier Transformed representative image data sets of said slice acquired using an individual pair of coils.

5. A system according to claim 1, wherein said image generator re-generates a composite MR image using image data sets provided by the selected subset of said plurality of RF coils excluding image data sets provide by remaining coils of said plurality of RF coils.

6. A system according to claim 1, wherein said coil selection processor selects said subset of said plurality of RF coils based on said correlation factor exceeding a predetermined threshold.

7. A system according to claim 1, wherein said coil selection processor selects a predetermined number of said plurality of RF coils having the highest degree of correlation as said subset.

8. A system according to claim 1, wherein said coil selection processor determines a list of coils comprising said prioritized ranking of said plurality of RF coils.

9. A system according to claim 1, wherein said image generator generates a composite MR image using image data sets provided by the selected subset of said plurality of RF coils excluding image data sets provided by remaining coils of said plurality of RF and by employing k-space domain parallel reconstruction.

10. A method for parallel image processing in an MR imaging system, comprising the activities of:

employing a plurality of MR imaging RF coils for individually receiving MR imaging data representing a slice of patient anatomy;

using the plurality of RF coils for acquiring a corresponding plurality of image data sets of said slice;

determining a prioritized ranking of said plurality of RF coils by, ranking individual coils of said plurality of RF coils based on correlation with remaining coils of said plurality of RF coils, said correlation being determined by determining degree of correlation of image data sets acquired by RF coil pairs comprising individual coils of said plurality of RF coils paired with individual remaining coils of said plurality of RF coils and selecting a subset of said plurality of RF coils using the ranking; and generating a composite MR image using image data sets provided by the selected subset of said plurality of RF coils excluding image data sets provide by remaining coils of said plurality of RF coils.

11. A method according to claim 10, including the activities of, using a first coil of said plurality of RF coils to acquire a first image data set representing said slice, using a second coil of said plurality of RF coils to acquire a second image data set representing said slice and ranking individual coils of said plurality of RF coils based on a correlation factor determined between the first and second image data sets.

12. A method according to claim 11, including the activity of determining said correlation factor between said first and second image data sets by determining cross-covariance between said first and second image data sets.

13. A method according to claim 12, including the activity of determining cross-covariance in response to multiplying data comprising Fourier Transformed representations of said first and second image data sets in the frequency domain.

14. A method according to claim 10, including the activity of ranking individual coils of said plurality of RF coils based on a correlation factor determined between pairs of coils of said plurality of RF coils.

15. A method according to claim 14, including the activity of ranking individual coils of said plurality of RF coils based on a peak value of said correlation factor.

16. A method according to claim 14, including the activity of determining individual correlation factors between individual pairs of coils of said plurality of RF coils by multiplying data comprising two Fourier Transformed representative image data sets of said slice acquired using an individual pair of coils.

17. A method according to claim 10, including the activity of re-generating a composite MR image using image data sets provided by the selected subset of said plurality of RF coils excluding image data sets provide by remaining coils of said plurality of RF coils.

18. A method according to claim 10, including the activity of
selecting said subset of said plurality of RF coils based on said correlation factor exceeding a predetermined threshold.

19. A method according to claim 10, including the activities of
identifying coils comprising said prioritized ranking of said plurality of RF coils and
selecting a predetermined number of said plurality of RF coils having the highest degree of correlation as said subset.

20. A method according to claim 10, including the activity of
generating a composite MR image using image data sets provided by the selected subset of said plurality of RF coils excluding image data sets provide by remaining coils of said plurality of RF coils and by employing k-space domain parallel reconstruction.

21. A method for parallel image processing in an MR imaging system, comprising the activities of:
employing a plurality of MR imaging RF coils for individually receiving MR imaging data representing a slice of patient anatomy;
using the plurality of RF coils for acquiring a corresponding plurality of image data sets of said slice;
determining a prioritized ranking of said plurality of RF coils by,
sorting and ranking individual coils of said plurality of RF coils based on a correlation factor determined between pairs of coils of said plurality of RF coils with remaining coils of said plurality of RF coils, said correlation being determined by determining degree of correlation of image data sets acquired by respective coils of said plurality of RF coils and
selecting a subset of said plurality of RF coils using the ranking; and
generating a composite MR image using image data sets provided by the selected subset of said plurality of RF coils excluding image data sets provide by remaining coils of said plurality of RF coils.

* * * * *